United States Patent [19]

Balakrishnan et al.

[11] 4,320,521
[45] Mar. 16, 1982

[54] DATA BUS TRANSCEIVER

[75] Inventors: Ramanatha V. Balakrishnan, Santa Clara; William R. Fowler, Sunnyvale, both of Calif.

[73] Assignee: National Semiconductor Corporation, Santa Clara, Calif.

[21] Appl. No.: 172,346

[22] Filed: Jul. 25, 1980

[51] Int. Cl.³ .............................................. H03K 4/94
[52] U.S. Cl. ..................... 375/36; 307/270; 307/263; 328/127
[58] Field of Search ..................... 178/63 C, 63 R; 307/106, 254, 263, 268, 270, 293, 294, DIG. 1, DIG. 4; 328/127, 128; 375/36, 60, 75

[56] References Cited

U.S. PATENT DOCUMENTS 3,453,452  7/1969  Starr ..................................... 307/263
3,858,059  12/1974  Khanna ................................ 307/268
3,868,519  2/1975  Green ................................... 307/263
4,184,045  1/1980  Philipson .......................... 178/63 R Primary Examiner—Benedict V. Safourek
Assistant Examiner—Stephen Chin
Attorney, Agent, or Firm—Gail W. Woodward; James A. Sheridan; Neil B. Schulte

[57] ABSTRACT

A data bus transceiver reduces self-induced noise by using trapezoidal drive waveforms. A differential receiver stage of the transceiver has a threshold voltage matched to the midpoint voltage of the drive waveform to reduce distortion, and a low-pass filter matched to the slew rate of the drive waveform to reduce noise while causing minimum progation delay. The transceiver has been integrated using back-to-back junction capacitors in the driver and filter circuits and these capacitors have been biased to reduce their variation in capacitance as a function of the voltage applied across them.

9 Claims, 6 Drawing Figures

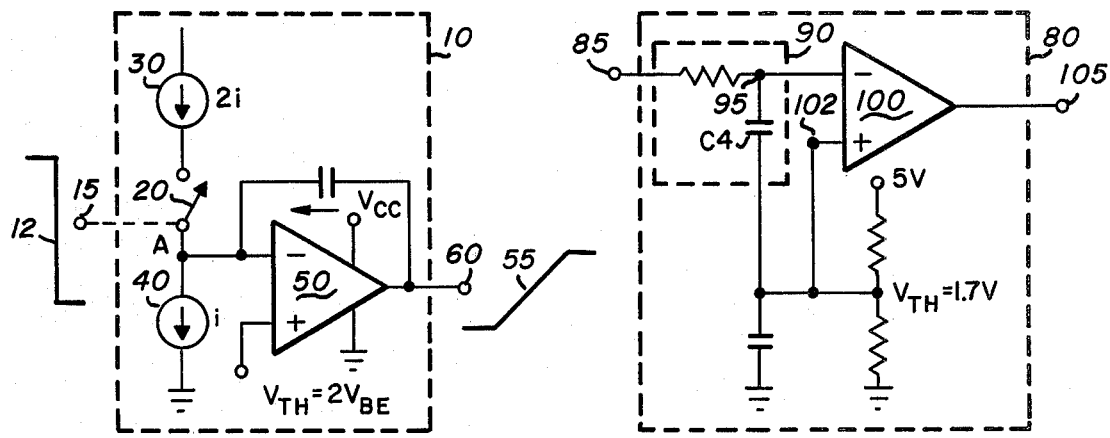
Fig_1
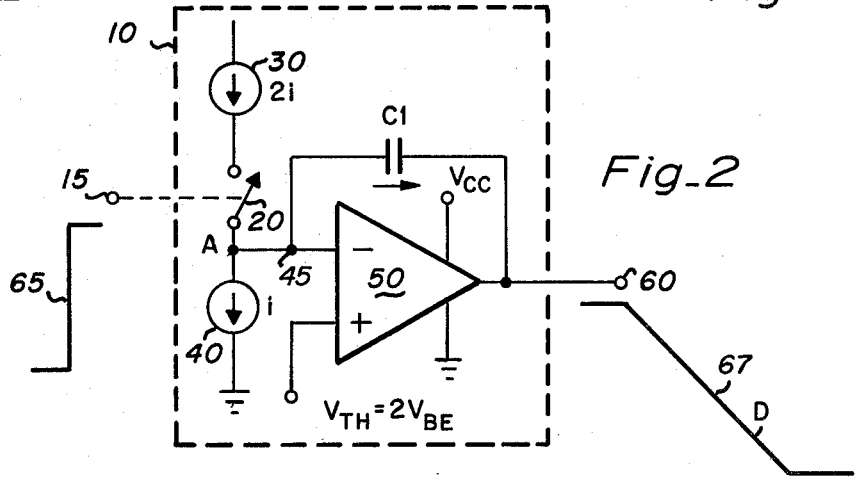
Fig_4
Fig_2
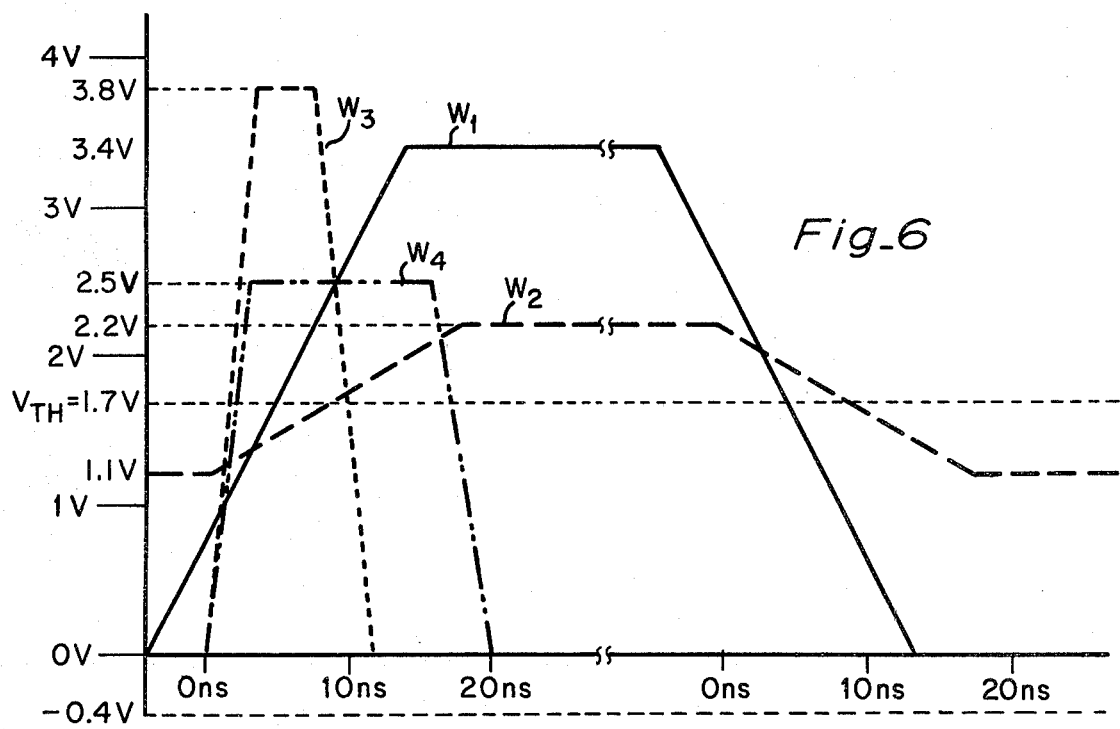
Fig_6

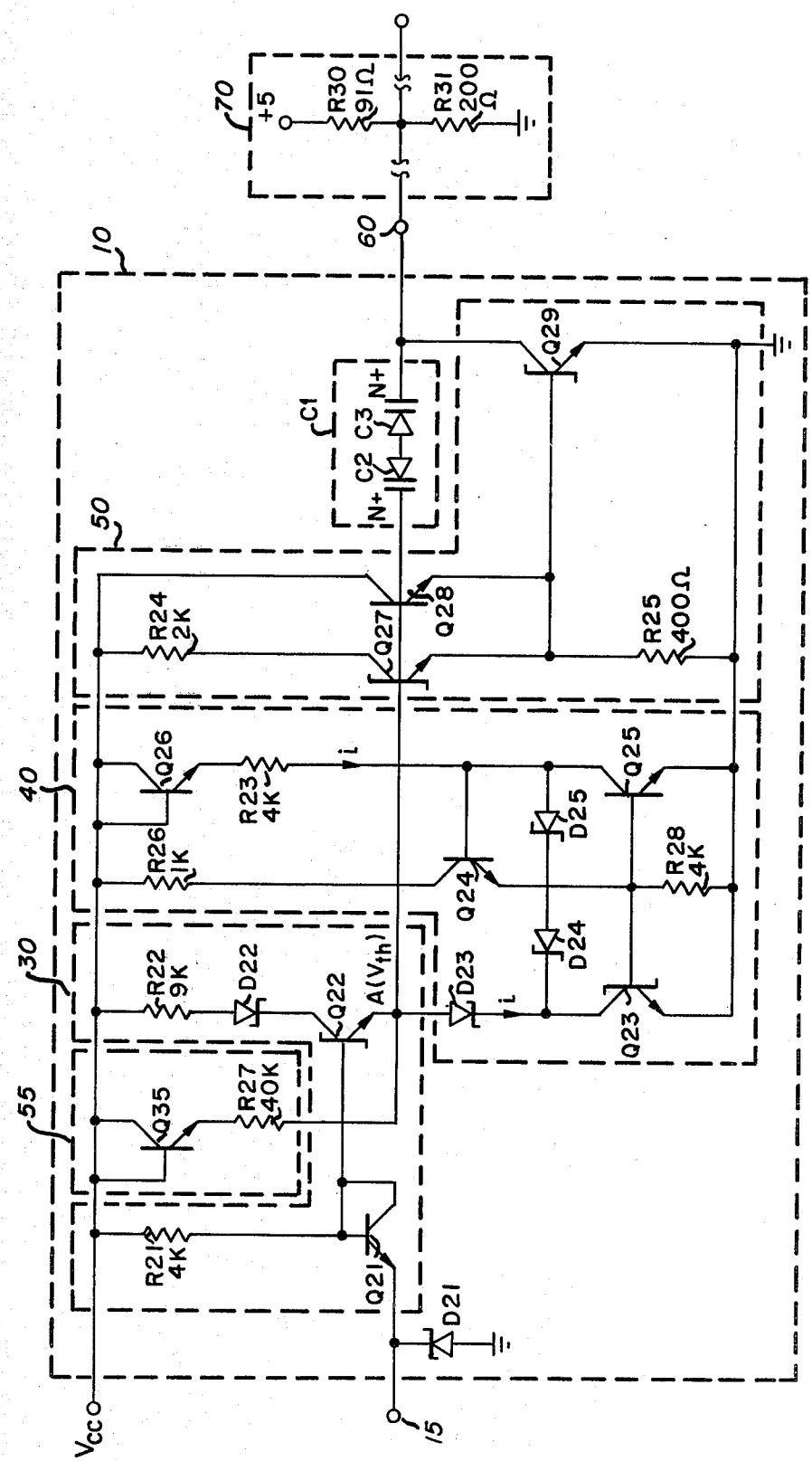
Fig_3

DATA BUS TRANSCEIVER

BACKGROUND OF THE INVENTION

1. Field of the Invention

The present invention is related to data bus transceivers for transmitting and receiving digital data on unbalanced data buses. More specifically, the present invention is related to transceivers having trapezoidal drivers and filtered differential receivers for reducing the effects of noise on a high-speed data bus.

2. Description of the Prior Art

Conventional computer systems use high-speed computer data buses employing Schottky bus transceivers for transferring digital data from one computer or peripheral device to another computer or peripheral device. These transceivers are designed to provide high-output currents for charging and discharging the relatively large bus capacitances quickly. These high-speed transitions are characterized by peak slew rates of approximately 5 volts per nanosecond. These high slew rates cause considerable noise to be capacitively coupled from one data line to adjacent data lines on the data bus. Additional noise may also be induced on the data lines by reflections and sources external to the data bus.

Conventional bus receivers are designed to respond to the high-speed transitions on the data bus and to provide for low propagation delays. Unfortunately, their fast response results in a high sensitivity to noise pulses on the data bus. The combined effect of the noise on the data buses and the sensitivity of the receivers to noise severely limits the total length of the data bus that can be used with acceptable reliability. For instance, typical minicomputer data buses are limited to bus lengths of ten feet or less by noise. It is desirable to extend the length of the data bus and still maintain high reliability in the data transferred.

Miller feedback integrators have been used to produce trapezoidal as drive waveforms resulting in a reduction in slew rates and the amount of noise coupled to adjacent lines. Such a circuit is taught in U.S. Pat. No. 3,453,452 entitled *Trapezoidal-Waveform Drive Method and Apparatus* issued to D. A. Starr, Jr. on July 1, 1969. However, Starr's circuit was directed towards a driver used in electrostatic multiple-electrode matrix printer apparatus of the type utilized for forming characters and symbols on record surfaces. Thus, Starr did not address the problems associated with receiving and reconstructing highspeed waveforms. One of the particular difficulties associated with the use of unbalanced trapezoidal drivers for high-speed data buses is that the trapezoidal pulses and the recovered digital waveforms must be of a high fidelity. Specifically, there must be a low distortion of the pulse width of transmitted pulses. Further, a transceiver must have a high degree of noise immunity and a minimum propagations delay. The present invention addresses the problems associated with transmitting and receiving high-speed waveforms on a data bus and reconstructing the original digital waveform quickly, with low distortion and with a high degree of noise immunity.

SUMMARY OF THE INVENTION

The preferred embodiment of the present invention is an integrated circuit data bus transceiver for transmitting and receiving digital data on an unbalanced data bus having a Miller integrator type driver for providing trapezoidal waveforms on the data bus in response to digital signals. The Miller capacitor is implemented with two back-to-back junction diodes having the terminal coupled to the negative input of the Miller integrator biased towards the midpoint voltage of the trapezoidal waveform. The receiver circuit is a differential type comparator having one input coupled to a voltage substantially equal to the midpoint of the trapezoidal waveform. The receiver also incorporates a low-pass filter for attenuating high-frequency noise. This low-pass filter has a time constant matched to the slew rate of the trapezoidal waveforms so as to optimize the noise immunity and propagation delay.

The low-pass filter incorporates back-to-back junction capacitors between the receiver input and a bias voltage substantially equal to the midpoint voltage.

BRIEF DESCRIPTION OF THE FIGURES

FIG. 1 is a block diagram of a data bus driver in accordance with the preferred embodiment of the present invention illustrating the response to a high-to-low transition of the digital data signal.

FIG. 2 is a block diagram of the data bus driver of FIG. 1 illustrating the response to a low-to-high transition of the digital data signal.

FIG. 3 is a detailed schematic diagram of the data bus driver of FIGS. 1 and 2 and the data bus.

FIG. 4 is a block diagram of a data bus receiver in accordance with the preferred embodiment of the present invention.

FIG. 6 is an illustration of a typical data and noise waveforms associated with the data bus of FIG. 3.

DETAILED DESCRIPTION OF THE INVENTION

Figure 5:
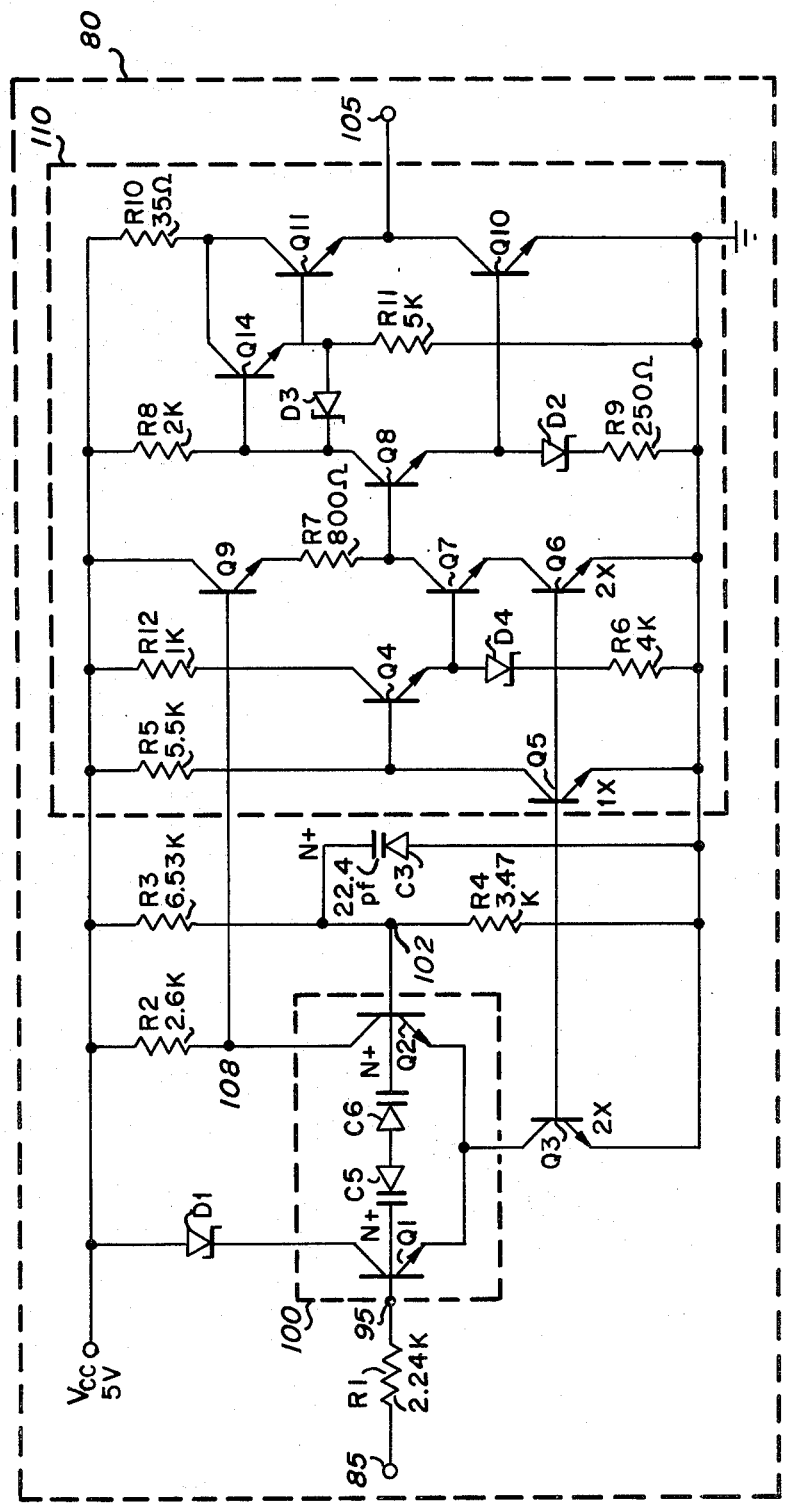
FIG. 5 is a detailed schematic diagram of the data bus receiver of FIG. 4.

FIG. 1 is a block diagram of a data bus driver 10. A digital data signal 12 is applied to input 15. Switch 20 opens in response to a high-to-low transition of digital data signal 12. The opening of switch 20 decouples current source 30 from node A, allowing current source 40 to draw current from node A. Current is drawn from node A pulling the voltage at node A to a low level causing output waveform 55 of comparator 50 to switch to a high level. Capacitor $C_1$ and comparator 50 are coupled in a conventional Miller integrator circuit such that the output slew rate of output comparator 50 on output terminal 60 is limited to $dV/dt = i/C_1$. The configuration of data bus driver 10 in response to a low-to-high transition of a digital data signal 65 applied to terminal 15 is illustrated in FIG. 2. Switch 20 couples current source 30 to node A in response to the low-to-high transition of digital data signal 65. Since current source 30 provides twice the current to node A as withdrawn from node A by current source 40, a net current of i supplied to node A flows toward negative input 45 of comparator 50. Capacitor $C_1$ now has a charging current i equal in magnitude but opposite in direction to the current shown in FIG. 1. This charging current produces an output waveform 67 on terminal 60 having a slew rate of $dV/dt = -i/C_1$. By matching the amplitudes of current sources 30 and 40 such that the amplitude of current source 30 is precisely double the amplitude of current source 40, the slew rates of the rising and falling output waveforms 55 and 67 are made to be substantially equal. This provides symmetrical waveforms on output terminal 60.

Data bus driver 10 has been implemented as an integrated circuit in order to provide the high-speed data rates required on computer data buses. The use of integrated circuits provides the required low-stray capacitances and high-speed circuitry. However, the feedback capacitor $C_1$ is difficult to implement accurately and inexpensively in an integrated circuit. In the preferred embodiment of the present invention, the feedback capacitor $C_1$ is implemented as a junction capacitor associated with the back-biased P-N junction of a transistor having its base coupled to its collector. However, junction capacitors are characterized by a capacitance which varies as a function of the applied voltage. Further, these capacitances are unidirectional. (In the reverse direction they are merely a forward biased diode junction characterized by a voltage drop of approximately 0.6 volts.) These disadvantages have been overcome in the circuitry described below.

FIG. 3 is a detailed schematic diagram of data bus driver 10 and the data has 70. Current source 30, which selectively supplies a 2i current to node A, is formed by transistors Q21 and Q22, resistors R21 and R22, and Schottky diode D22. Transistors Q21 and Q22 perform the function of switch 20 and disable current source 30 in response to a low-level signal occurring on input terminal 15. A high-level signal on input terminal 15 causes transistor Q21 to become nonconductive. This increases the voltage applied to the base of transistor Q22, turns on transistor Q22 and causes current to be supplied to node A through resistors R21 and R22.

Current source 40 comprises transistors Q23–Q26, diodes D23–D25, and resistors R23, R26 and R28. Resistor R23 has a voltage applied across it approximately equal to the value of the voltage supply $V_{CC}$ less three base-to-emitter voltage drops ($3V_{BE}$). This applied voltage ($V_{CC}-3V_{BE}$) is approximately the same voltage as applied across resistors R21 and R22 when current source 30 is active. Since the resistances of resistors R21, R22 and R23 are equal, the current i flowing through resistor R23 is substantially equal to the current flowing through either resistor R21 or R22, which is approximately equal to one-half the current supplied by current source 30. Transistors Q23 and Q25 are coupled in a conventional current mirror circuit which draws a current from node A substantially equal to the current flowing through resistor R23 and transistor Q25. Thus, current sources 30 and 40 will track each other and maintain a 2:1 current ratio for variations of the supply voltage $V_{CC}$ and temperature which can cause variations in the base-emitter voltage drop $V_{BE}$.

Transistors Q27–Q29 and resistor R24 make up the high-speed comparator 50. Comparator 50 has a threshold voltage equal to two base-to-emitter drops ($2V_{BE}$) which is approximately 1.6 volts. Comparator 50 is coupled to output terminal 60 in a pull-down arrangement. In operation, when a charging current causes the voltage at node A to exceed the voltage threshold of comparator 50, transistor Q29 will tend to pull the voltage on the output terminal 60 to ground at a slew rate limited by the Miller integrator circuit.

Feedback capacitor C1 is implemented as back-to-back junction capacitors C2 and C3. Thus, one of the junctions is always back-biased. These capacitors each have capacitances of approximately 10 pf which determines the slew rates and rise and fall times of the output signal. The junction capacitors require a relatively small die area. Further, the back-to-back configuration allows the voltage applied across the combined capacitances to be bipolar. However, junction capacitors have capacitances which are sensitive to the applied voltage. This effect has been minimized by coupling the input of the Miller integrator at node A to a voltage that is approximately equal to the midpoint of the dynamic range of the output signal. The dynamic range of the output is a function of the data bus characteristics and of the high-speed comparator. In the preferred embodiment, the output signal has a voltage which varies from approximately 0 volts to approximately 3.4 volts. Thus, the midpoint of the trapezoidal output is approximately 1.7 volts. The junction capacitors are biased towards this voltage to 1/6 volts ($2V_{BE}$), which reduces the capacitive variation of the junction capacitors C2 and C3 due to voltage variations. Ideally, the threshold voltage of the Miller integrator would be biased to a voltage substantially equal to, for instance, within 5% of the midpoint voltage, in order to minimize this capacitive variation, however, in the preferred embodiment the use of the $2_{VBE}$ voltage is a cost effective expedient.

Transistor Q35 and resistor R27 comprise a glitch-free power up/down circuit 55. Transistor Q35 ensures that transistor Q29 will not conduct until the voltage supply $V_{CC}$ reaches an amplitude of at least $3V_{BE}$. By the time the voltage supply reaches this amplitude, the rest of the circuit is fully operational. This provides a measure of assurance that the operation of the circuit will be glitch-free.

Data bus driver 10 is coupled to a data bus 70. This data bus is characterized by a resistor R30 of 91 ohms coupled between the data bus and a 5-volt supply and a 200 ohm resistor R31 coupled between the data bus and ground. These resistances determine the maximum voltage of the trapezoidal waveforms on the data bus. Specifically, when Q29 is nonconducting, the voltage divider action of resistors R30 and R31 pulls the voltage of data bus 70 to a voltage of 3.4 volts. When transistor Q29 is conducting, the voltage of the data bus is pulled to ground. In both cases, the signal on the data bus is slew rate limited by the Miller integrator capacitor C1 and the amplitude of the current i.

The other end of data bus 70 is coupled to data bus receiver 80, illustrated in the block diagram FIG. 4. Input terminal 85 of data bus receiver 80 is coupled to data bus 70. A low pass filter 90 attenuates high-frequency noise on the data bus and has a time constant selected so as not to substantially attenaute the trapezoidal waveforms of the data. The filtered data signals are applied to negative input 95 of differential comparator 100. Positive input 102 is coupled to a dc voltage substantially equal to, that is, within 5%, of the midpoint voltage of the trapezoidal drive waveform. In the preferred embodiment of the present invention, the midpoint of the drive and the received trapezoidal waveforms are both approximately 1.7 volts even though the ac modulation of the waveform may be attenauted by the data bus. The output digital signal is provided at output terminal 105.

Data bus receiver 80 is illustrated in detail in the detailed schematic diagram FIG. 5. Low-pass filter 90 comprises junction capacitors C5 and C6 and resistors R1, R3 and R4. Capacitor C6 has it N+ terminal coupled to a dc bias voltage substantially equal to the midpoint voltage of 1.7 volts. Since this voltage is substantially equal to the midpoint voltage of the received trapezoidal waveform, the variations in capacitance of the back-to-back junction capacitors C5 and C6 resulting from the voltage variations of the input signal are minimized. This improves the symmetry of the receiver response to negative and positive going portions of the waveform.

Transistors Q1 and Q2 form the differential input stage of the receiver. The data signal received at input terminal 85 is compared to the voltage applied to the base of transistor Q2 which is biased to a dc voltage of 1.7 volts by resistors R3 and R4. This threshold voltage is matched to the midpoint voltage of the received trapezoidal waveform and to provide a symmetrical response to the positive and negative edges of the trapezoidal waveforms. This provides for a low distortion in the pulse width and fidelity of the recovered digital data.

The frequency response of the low-pass filter is matched to the slew rate of the trapezoidal waveforms to optimize the response of the receiver while eliminating a maximum amount of high-frequency noise. Specifically, the slew rate of the trapezoidal signal is matched to the time constant of the low-pass filter. For example, if the rise time for a 3.4 volts signal to rise from 10% to 90% of its peak value is 15 nanoseconds, $3.4/(T=RC)=(0.80\times3.4)/15$ and $T=19$ seconds. A 20 nanosecond time constant for the RC low-pass filter 90 is used in the preferred embodiment of the present invention. This circuit typically rejects a 20 nanosecond-wide noise pulse having an amplitude of 2.5 volts while passing a 40 nanosecond-wide data signal having an amplitude of 3.4 volts and rise and fall times of 15 nanoseconds. The 20 nanosecond time constant results in a typical propagation delay time of 30 nanoseconds and a maximum delay time of 45 nanoseconds over a 0°–70° C. temperature range.

The output of the differential stage at node 108 is coupled to the input of a standard totem pole amplifier stage 110 through a level shift circuit consisting of transistor Q9 and resistor R7. Diode D1 in the collector circuit of transistor Q1 provides a high-impedance input to the data bus when no power is applied to the receiver ($V_{CC}=0$).

FIG. 6 is an illustration of typical data and noise waveforms associated with the data bus. As illustrated, drive waveform W1 is characterized by maximum and minumum drive voltages of 3.4 and 0 volts respectively. Typically, rise and fall times are 10 to 20 nanoseconds with 15 nanoseconds being preferred. Pulse widths of the drive waveforms, from threshold voltage to threshold voltage, are typically greater than 100 nanoseconds. Waveform W2 illustrates a typical data signal received at terminal 85 of data bus reciever 80 after being attenuated by a long data bus. Waveforms W3 and W4 illustrate typical noise waveforms induced on the data line which are rejected by data bus receiver 80.

While the invention has been particularly taught and described with reference to the preferred embodiments, those versed in the art will appreciate that minor modifications in form and detail may be made without departing from the spirit and scope of the invention. Accordingly, all such modifications are embodied within the scope of this patent as properly come within our contribution to the art and are particularly pointed out by the following claims.

We claim:

1. A transceiver circuit for transmitting and receiving digital data on a data bus, the circuit comprising:
    trapezoidal driver means responsive to the digital data and coupled to the data bus for applying a trapezoidal signal to the data bus in response to the digital data, the trapezoidal signal having controlled leading and trailing edge slopes and characterized by a dynamic range and a midpoint voltage;
    a low-pass filter for attenuating the high frequencies of a signal received at the input thereof and having an output thereof for providing the attenuated signal;
    a threshold voltage source for providing a threshold voltage having an amplitude approximately equal to the midpoint voltage;
    a differential receiver having a first input coupled to the output of the low-pass filter and a second input coupled to receive the threshold voltage for providing an output signal having a first value in response to the signal received on the first input having an amplitude greater than the threshold voltage, the output signal having a second value otherwise.

2. A transceiver as in claim 1 wherein the trapezoidal driver means comprises a Miller integrator having a positive and negative input and a switchable current source coupled to the negative input of the Miller integrator.

3. A transceiver circuit as in claim 2 wherein the positive input of the Miller integrator is biased to a voltage having an amplitude between the maximum and minumum voltages of the trapezoidal signal.

4. A transceiver circuit as in claim 3 wherein the feedback capacitor of the Miller integrator comprises back-to-back P-N junctions.

5. A transceiver circuit as in claim 4 wherein the positive input of the Miller integrator is biased to a voltage approximately equal to the midpoint voltage.

6. A transceiver circuit as in claims 1 or 2 or 3 or 4 wherein the time constant of the low-pass filter is matched to the slew rate of the trapezoidal signal.

7. A transceiver circuit as in claim 6 wherein the low-pass filter comprises back-to-back junction capacitors having one end of the back-to-back junction capacitors is coupled to receive the trapezoidal signal and the other end is biased to a voltage having an amplitude between the maximum and minimum voltages of the trapezoidal signal.

8. A transceiver circuit as in claim 7 wherein the other end of the back-to-back junction capacitors is biased to a voltage approximately equal to the midpoint voltage.

9. A transceiver circuit as in claim 8 wherein the back-to-back junction capacitors of the low-pass filter are coupled between the first and second inputs of the differential receiver.

* * * * *